US006294028B1

(12) United States Patent
Bell et al.

(10) Patent No.: US 6,294,028 B1
(45) Date of Patent: Sep. 25, 2001

(54) MERCURY PROCESS GOLD BALLBOND REMOVAL APPARATUS

(75) Inventors: Paul D. Bell, Colchester; Glenn L. Bomberger, Hinesburg; Allen W. Brouillette, Essex Junction, all of VT (US); Todd McMullin, Frisco, TX (US); Richard W. Wasielewski, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/298,690

(22) Filed: Apr. 23, 1999

(51) Int. Cl.$^7$ ...................................................... C23G 1/02
(52) U.S. Cl. .................................... 134/3; 134/2; 134/10; 134/16; 134/18; 134/21; 134/26; 134/28; 134/32; 134/34; 134/36; 134/41; 134/42; 134/61; 134/76; 134/83; 134/111
(58) Field of Search ............................... 134/2, 3, 10, 16, 134/18, 21, 26, 28, 32, 34, 36, 41, 42, 61, 76, 83, 111; 216/90, 91, 100

(56) References Cited

U.S. PATENT DOCUMENTS

| | | | |
|---|---|---|---|
| 5,049,718 | * | 9/1991 | Splotter et al. ................. 219/121.64 |
| 5,424,254 | | 6/1995 | Damiot .................................. 437/243 |
| 5,429,642 | | 7/1995 | Ohkuma .............................. 29/25.01 |

\* cited by examiner

*Primary Examiner*—Sharidan Carrillo
(74) *Attorney, Agent, or Firm*—DeLio & Peterson, LLC; Peter W. Peterson; Howard J. Walter, Jr.

(57) ABSTRACT

A method and apparatus for reducing the risk of environmental contamination from mercury spillage during carry over between processing tanks during the gold ball bond removal process by providing a self-contained, compact, environmentally safe system for use with toxic chemicals and liquids. The present invention provides a self-contained, integrally molded enclosure upper and lower chambers separated by a partition. The partition has a plurality of stations integrally formed therein, each of which is capable of containing a chemical liquid. The method comprises dipping a slide containing the semiconductor chip first into a toxic liquid, then into a first decontamination station and finally into a second decontamination station.

7 Claims, 1 Drawing Sheet

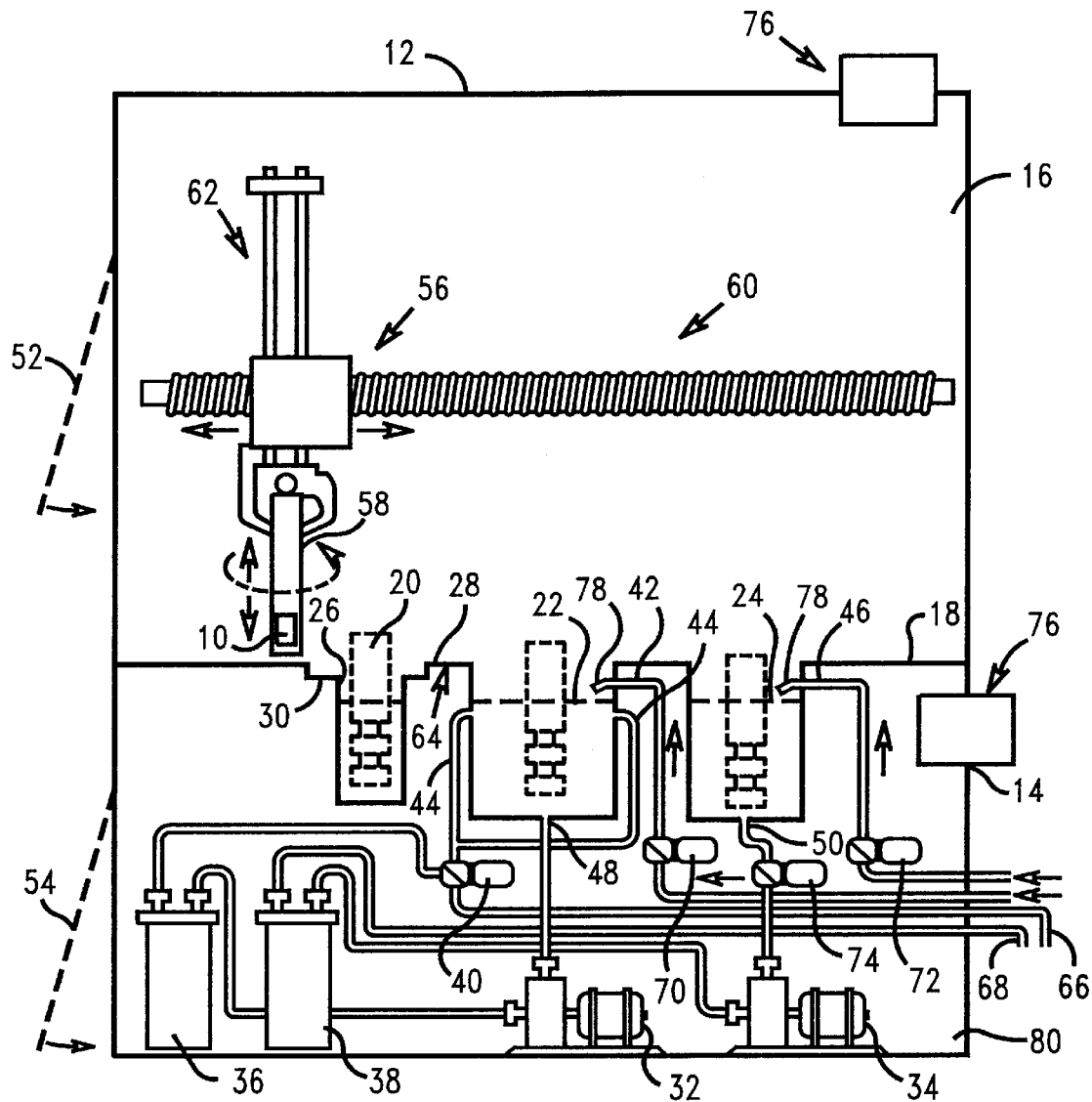

MERCURY PROCESS GOLD BALLBOND REMOVAL APPARATUS

BACKGROUND OF THE INVENTION

1. Field of the Invention

The present invention relates generally to an apparatus and method for reducing the risk of environmental contamination by toxic chemicals, and, in particular, to an apparatus and method for reducing the risk of environmental contamination by mercury and mercury salts used during the removal of gold ballbonds from the pads of a semiconductor device.

2. Description of Related Art

In the course of the failure analysis of semiconductor devices, one of the first steps involves the removal of the gold ball bonds that are used to connect the pads of the semiconductor device to the module leads. It is well known that gold will dissolve in liquid mercury and the technique is used to remove the gold ball bonds from semiconductor pads. For example, in U.S. Pat. No. 5,424,254, a semiconductor chip is laid down to float in an agitated mercury bath to remove gold ball bond connections. Generally, the technique involves black waxing the semiconductor device to a glass slide which is then dipped into a beaker of mercury, then into a beaker of nitric acid, then in a beaker of water, and then rinsed under a spigot in a sink. This process can be carried out manually, or more commonly by an automated carrier transfer system. In U.S Pat. No. 5,429,642, a method and apparatus is disclosed for transferring wafers from one processing station to another in a clean room or on a clean bench, to be dipped into a chemical liquid at each station.

During the gold ball bond removal process, when the dipped slide is removed from the mercury bath, particles of mercury remain attached to the slide and semiconductor device and are carried over into the nitric acid bath. These residual particles are dissolved in the nitric acid bath. The nitric acid is then removed from the slide and device by the water rinse. During the water rinse, it is possible for dissolved mercury to precipitate out as liquid mercury. It is also possible, that during movement of the slide from bath to bath, mercury particles, acid containing mercury salts, or water containing mercury salts, will spill or drip from the slide and down onto the work space or area. For health and environmental reasons, liquid mercury and liquids containing mercury salts cannot be allowed to remain on equipment or be flushed down industrial drains. While the automated transfer system reduces the risk of direct human contact with mercury or other toxic liquids, the containment of contaminants and spillage during the gold ball bond connection removal process and preventing contaminants from being introduced into an industrial waste line remains a problem.

Bearing in mind the problems and deficiencies of the prior art, it is therefore an object of the present invention to provide an apparatus and method which will reduce mercury contamination of the environment during the gold ball bond removal process.

Another object of the invention is to provide a method and apparatus to contain mercury spillage during carry over between processing tanks during the gold ball bond removal process.

Yet another object of the invention is to provide a method and apparatus to reduce the risk of environmental contamination and the discharge of mercury and mercury salts into industrial waste lines during the gold ball bond removal process.

Still another purpose of the invention is to provide an apparatus for gold ball bond connection removal which is self-contained, compact in size, efficient and yet environmentally safe.

Yet another purpose of the invention is to provide a self-contained, compact, environmentally safe system for use with toxic chemicals and liquids.

Still other objects and advantages of the invention will in part be obvious and will in part be apparent from the specification.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a self-contained wet processing system for toxic materials comprising an enclosure having a plurality of stations contained within the enclosure, each station capable of containing a chemical liquid or water. There is at least one workpiece handler in the enclosure adapted to move workpieces through the enclosure from station to station. In the preferred embodiment, at least one station in the enclosure contains a toxic liquid such as mercury, a first decontamination station containing a first decontaminating liquid such as acid and a second decontaminating station containing a rinse liquid, such as water. The first decontamination station receives and decontaminates a contaminated workpiece, and includes a contaminant separator. The second decontamination station is for receiving a partially decontaminated workpiece for further decontamination and is adapted to render the workpiece safe for human handling.

It is preferred that the enclosure be comprised of an upper and lower chamber, the upper and lower chambers being separated by a partition which seals the upper chamber from said lower chamber. It is also preferred that the partition comprise an integrally formed flat plate having a plurality of openings integrally formed therein, each opening being in the form of a container having a sidewall and a base. Each container defines one of the stations capable of containing a chemical liquid or water.

In the preferred embodiment, the toxic liquid station is adapted to receive a removable tank. Preferably, the removable tank is made of glass and has a mouth, a base and a sidewall, and a flange extending horizontally outward from the top of the sidewall around the mouth of the removable tank. The flange may be adapted to be received in a recess integrally formed in the partition around the opening of the toxic liquid station.

In another preferred aspect, both the first and second decontamination station bases have at least one opening integrally formed therein for draining the decontamination station. One of the sidewalls of both the first and second decontamination station may have at least one opening integrally formed therein for filling the station with decontamination liquid. The opening in the sidewall of the decontamination station may also be used to re-circulate the decontamination liquid.

In the preferred embodiment, the first decontamination station drain is connected to a first pump for directing the first decontamination liquid through a first filter to remove contaminants and back to the first decontamination station or out to a first waste line. It is also preferred that the second decontamination station drain be connected to a second pump for directing the second decontamination liquid through a second filter to remove contaminants and out to a second waste line.

In the preferred embodiment, the upper chamber is a molded glass enclosure to allow viewing of the workpiece handler and workpiece during processing. The upper chamber may also have an environmentally sealable door to allow for loading the workpiece onto the workpiece handler.

It is preferred that the workpiece handler comprises a transport mechanism adapted to hold a slide having at least one semiconductor chip mounted thereon. The workpiece handler is preferably adapted to move in an X direction to position the slide over one of the stations and in a Y direction for lowering the slide into one of the stations. In the preferred embodiment, the workpiece handler is further adapted to move said slide in a reciprocating rotational movement to dislodge the toxic substance into the station.

In another preferred embodiment, the present invention relates to an environmental containment system for removing gold ball bonds on the pads of a semiconductor device. The containment system comprises a self-contained enclosure having a lower and upper chamber, a partition between the lower and upper chamber which seals the upper chamber from the lower chamber. The partition has a first container integrally molded therein which is adapted to receive a removable container, preferably containing mercury.

Preferably, the partition has a second container integrally molded therein, the second container adapted to hold a mercury dissolving liquid. In the preferred embodiment, the second container has a sidewall and a base, with the sidewall having at least one opening formed therein with a line attached thereto for bringing fresh mercury dissolving liquid into the second container. The second container may also have a drain formed in the base to remove and re-circulate used mercury dissolving liquid. It is also preferred that a first pump is connected to the second container drain. The first pump is preferably connected to a first filter and is used to remove mercury contaminants from the mercury dissolving liquid pumped out of the second container by the first pump. A valve may preferably be connected to the first filter to direct the flow of filtered mercury dissolving liquid back to a re-circulating line connected to an opening in the second container sidewall or out to a first waste line.

It is also preferred that the partition have a third container integrally molded therein which is adapted to hold a rinsing liquid. The third container also has a sidewall and a base, with the sidewall having at least one opening formed therein with a line attached thereto for bringing fresh rinsing liquid into the third container. A drain may be formed in the base to remove rinsing liquid from the third container. In the preferred embodiment, a second pump is connected to the third container drain, the second pump being connected to a second filter. The second filter is used to remove partially dissolved mercury contaminants from the rinsing liquid pumped out of the third container by the second pump. The second filter is preferably connected to a first waste line to receive the filtered rinsing liquid.

In the preferred embodiment the containment system further comprises a transport mechanism mounted in the upper chamber which is adapted to hold a slide having a semiconductor chip mounted thereon. In the most preferred embodiment, the transport mechanism is capable of moving and dipping the slide first into the mercury tank, then into the acid tank and finally into the water tank.

In another aspect, the present invention relates to a method for removing gold ball bonds on the pads of a semiconductor device. The method includes:

providing an environmentally sealed enclosure having a door for loading. Preferably, the enclosure has an upper and lower chamber in which the upper chamber is environmentally sealed from the lower chamber;

providing a transport mechanism in the upper chamber which is adapted to hold a slide having a semiconductor chip mounted thereon;

providing a first tank containing mercury;

providing a second tank containing a mercury dissolving liquid such as nitric acid, the second tank being adapted to re-circulate the mercury dissolving liquid through a first filter for collecting elemental mercury and back into the second tank or out to a first waste line;

providing a third tank containing a rinsing liquid such as water, the third tank adapted to filter used rinse water through a second filter for collecting elemental mercury prior and direct the filtered rinse water out to a second waste line;

mounting the semiconductor chip onto the slide in the upper enclosure;

then in sequence, moving and lowering the slide into the mercury container to immerse the semiconductor chip to a first depth and removing the slide from the mercury container;

repositioning and lowering the slide into the mercury dissolving container to immerse the semiconductor chip in the mercury dissolving liquid to a second depth which is deeper than the first depth, and rotating the slide in a reciprocating motion to dislodge droplets of mercury into the mercury dissolving liquid;

removing the semiconductor chip from the mercury dissolving container and repositioning and lowering the slide into the rinse container to immerse the semiconductor in the rinsing liquid to a third depth which is deeper than the second depth, and rotating the slide in a reciprocating motion to dislodge droplets of mercury into the rinsing liquid; and removing the slide from the rinse container and removing the slide and semiconductor chip from the system.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawing in which:

FIG. 1 is a elevational side view of the preferred embodiment of the present invention.

DESCRIPTION OF THE PREFERRED EMBODIMENT(S)

In describing the preferred embodiment of the present invention, reference will be made herein to FIG. 1 of the drawing in which like numerals refer to like features of the invention. Features of the invention are not necessarily shown to scale in the drawing As shown in FIG. 1, an enclosure 12 is provided having an upper chamber 16 and a lower chamber 14, and separated by partition 18. Enclosure 12 is a self contained, integrally formed or molded container, which can be environmentally sealed to prevent the inadvertent release of any toxic materials contained within it. The enclosure 12 can be constructed of any material which is acid resistant and safe for containing toxic materials, such as stainless steel or plexiglass. The preferred enclosure material is glass, which is non-reactive with nitric acid. The enclosure material should be capable of being molded or integrally formed into its shape so as to avoid any sharp corners or crevices within the enclosure. Optionally, upper chamber 16 may be constructed of one material, such as glass, while lower chamber 14 is constructed from another material, such as stainless steel. The size of the enclosure should be adequate to house the apparatus described below, but is preferably on the order of 2'×2'×2' (609.6 mm×609.6 mm×609.6 mm). Preferably the thickness of the walls of enclosure 12 is approximately ¼" (6.35 mm). The lower chamber may be built from a gage of stainless steel approximately ⅛" (3.175 mm) thick. The partition between the upper and lower chamber 18 is preferably ⅛" (6.35 mm) Teflon or other plastic material which is resistant to nitric acid.

Enclosure 12 preferably has an access panel door 52 on the upper chamber 16 to allow access into the chamber 16. The lower chamber 14 should also have an access door 54 to allow access to the equipment stored therein for servicing. Both doors 52 and 54 should be capable of environmentally sealing the enclosure when the doors are closed to prevent the release of any toxic fumes or contaminants.

If enclosure 12 is constructed of a non-transparent material, upper chamber 16 should include a view port to enable the user to see transport mechanism 56 and slide 58 during system operations.

Upper chamber 16 contains a workpiece handler or transport mechanism 56 which is capable of holding slide 58 having chip 10 mounted thereon. Transport mechanism 56 should be capable of moving horizontally along the X direction and vertically in the Y direction in order to position slide 58 over, and dip slide 58 into, each of tanks 20, 22, or 24. Transport mechanism 56 should also be able to move in a reciprocating rotational P direction movement about the Y axis in order to dislodge droplets of mercury. In the preferred embodiment, transport mechanism 56 is capable of lowering slide 58 deeper into tank 22 than tank 20, and deeper into tank 24 than tank 22. Transport mechanism 56 may be automated with limit switches and timers to control movement of slide 58 or may be hand cranked with stops. For X direction motion, threaded rod 60 may be used, or alternatively, a pull wire. For Y direction motion, hydraulic piston 62 may be used, or alternatively, a threaded rod or hand slide may be used. For P direction movement, an offset cam or manual lever may be used.

Partition 18 is preferably a molded, integrally formed piece, of a material such as stainless steel or glass, having stations or liquid holding containers 20, 22 and 24 molded therein. Partition 18 seals upper chamber 16 from lower chamber 14. Containers 20, 22 and 24 should be integrally formed in partition 18 in order to avoid the formation of crevices along partition 18 that might trap mercury or toxic contaminants that spill. At least three containers should be formed in partition 18; a container 20 for holding a toxic liquid such as mercury, a container 22 for holding a first decontaminating liquid such as nitric acid, and a container 24 for holding a second decontamination, or rinse liquid, such as water. Each of the containers should be kept as small as possible. Preferably, toxic container 20 should have an opening approximately 3 inches (76.2 mm) across and be capable of holding a minimum of 150 ml of liquid. Acid container 22 should have an opening approximately 4 inches (101.6 mm) across and be capable of holding approximately 200 ml of liquid. Water rinse container 22 should also have an opening approximately 4 inches (101.6 mm) across and be capable of holding approximately 200 ml of liquid. The mouths of containers 20, 22, and 24 open into upper chamber 16, and the containers extend down into lower chamber 14. The mouths of containers 20, 22 and 24 are integrally formed in partition 18 in order to contain all liquids and materials in upper chamber 16 in case of a spill.

Toxic container 20 is adapted to hold a removable container 26. Partition 18 has a recess 30 molded therein, around the mouth of container 20 to engage flange 28 of removable container 26. Recess 30 is deep enough to form lip 64 around the mouth of container 20 when removable container 26 is inserted into container 20. Lip 64 prevents mercury contained in removable container 26 from spilling onto the floor of the upper chamber.

Acid container 22 has opening 42 which is fitted with a line for bringing fresh acid into container 22. Acid container 22 also has a drain 48 in its base for recirculating and removing acid out of container 22. Acid container 22 may also be fitted with additional openings 44 to allow filtered acid to be recirculated into container 22.

Water container 24 is a rinse and dump tank. Water container 24 has opening 46 which is fitted with a line for bringing fresh water into container 24. Container 24 also has opening 50 in its base for draining water out of container 24.

It is preferred that the in and out fittings for containers 22 and 24 be fused or molded directly into the walls of the containers to connect to pumps and filters located in lower chamber 14. It is preferred that any seams and pass-thrus be minimized and constructed to reduce crevices that could trap mercury.

Lower chamber 14 houses the mechanical liquid systems including acid filter 36, water rinse filter 38, acid pump 32 and water pump 34. In addition to access door 54, lower chamber 14 has a removable containment tray 80 to reduce contamination of the system in the event of a leak and provide for easy cleanup. Containment tray 80 may be a chemical resistant tray measuring approximately 18"×6"×½" (457.2 mm×152.4 mm×12.7 mm) to be placed under tanks 20, 22, 24.

The flow of fresh acid into acid container 22 may be controlled by valve 70. Before the acid from container 22 is recirculated or sent to waste collection, it is filtered to remove any liquid mercury particles that have not completely dissolved or might otherwise precipitate out. Pump 32 receives acid from container 24 through opening 48. Pump 32 then pumps the acid through filter 36 and to valve 40. Valve 40 may be used to direct the flow of filtered acid either back into acid container 22 or out to a first waste line 66 to be collected. The filtered acid is pumped back into container 22 through openings 44. Pumps 32, 34 are preferably Teflon low flow sampling pumps which have a flow rate between 150–250 ml/min. The pumps must be self priming and be able to run dry without damaging the pump internals. Filters 36 and 38 are preferably disposable Teflon PTFE membrane filters with a ¼"–⅜" (6.35–9.525 mm) hose connection. A membrane pore size of 1 um with a filter area of 260 cm$^2$ may be used.

Valve 72 may be used to control the flow of fresh water into water container 24. Valve 74 can be used to control the flow of water out of water container 24 through opening 50 to pump 34. The water is then pumped by pump 34 through filter 38 in order to trap any liquid mercury particles that have not completely dissolved or may precipitate out before the water is pumped to second waste line 68 to be collected.

The valves used to control the flow of liquid through each of the containers, pumps and filter may be manual valves or solenoid valves optionally controlled by timers.

Optionally, enclosure 12 may also contain exhaust fans 76 in both the upper 16 and lower 14 chambers. A set of spray nozzles 78 may optionally be attached at the end of inlet lines 42 and 46 to spray acid and/or water directly into the respective container.

In operation, a chip 10 is mounted onto slide 58 and connected to transport mechanism 56. Transport mechanism 56 then positions slide 58 above the mercury container 20 and lowers slide 58 into the mercury. Slide 58 is lowered into the mercury to a position which fully submerges chip 10 in the mercury. The system is intended to be used with 75 mm×25 mm glass sample slides. Transport mechanism 56 is preferably adjusted so that approximately 40 mm of slide 58 is submerged into the mercury to cover chip 10. The immersion time of chip 10 in the mercury may be approximately 30 to 60 minutes. Slide 58 is then lifted out of the mercury and dipped into acid container 22. Slide 58 is preferably immersed deeper into the acid than in the mercury. Slide 58 may be immersed in the acid to a depth of approximately 50 mm below the level of the acid within the tank. The acid level should be set to approximately 20 mm below the height of spray nozzle 78 in order to clean mercury off the device during removal. While in the acid, the slide is rotated back and forth in a reciprocal P motion in the Y axis to dislodge any droplets of mercury attached to chip 10 and slide 58. Slide 58 remains immersed in container 24 for approximately 15 to 30 seconds.

Slide 58 is then removed from acid container 22 and lowered into water rinse container 24. Slide 58 is lowered into water rinse container 24 to a depth which is deeper than the depth to which slide 58 was lowered into acid container 22 and preferably to a depth of at least 60 mm. While in water rinse container 24, the slide is rotated back and forth in a reciprocal P motion in the Y axis to dislodge any remaining droplets of mercury attached to chip 10 and slide 58. Slide 58 is then removed from the water and removed from the enclosure for examination.

Thus, the method and apparatus of the present invention reduces the risk of environmental contamination from mercury spillage during carry over between processing tanks during the gold ball bond removal process by providing a self-contained, compact, environmentally safe system for use with toxic chemicals and liquids.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An environmental containment system for removing gold ball bonds on the pads of a semiconductor device comprising:
   a self-contained enclosure having a lower and upper chamber;
   a partition between the lower and upper chamber, said partition sealing the uppers chamber from the lower chamber, said partition having a first container integrally molded therein, said first container receiving a removable container of mercury;
   said partition having a second container integrally molded therein, said second container holding a mercury dissolving liquid, said second container having a sidewall and a base, said sidewall having at least one opening formed therein with a line attached thereto for bringing fresh mercury dissolving liquid into the second container and a drain formed in the base to remove and recirculate used mercury dissolving liquid; and
   said partition having a third container integrally molded therein, said third container holding a rinsing liquid, said third container having a sidewall and a base, said sidewall having at least one opening formed therein with a line attached thereto for bringing fresh rinsing liquid into the third container and a drain formed in the base to remove rinsing liquid from the third container.

2. The apparatus of claim 1, further comprising a first pump connected to the second container drain:
   a first filter connected to said first pump, said first filter used to remove mercury contaminants from the mercury dissolving liquid pumped out of said second container by said first pump; and
   a valve connected to said first filter to direct the flow of filtered mercury dissolving liquid back to a recirculating line connected to an opening in the second container sidewall or out to a first waste line.

3. The apparatus of claim 1, further comprising a second pump connected to the third container drain:
   a second filter connected to said second pump, said second filter used to remove partially dissolved mercury contaminants from the rinsing liquid pumped out of said third container by said second pump; and
   said second filter connected to a first waste line to receive the filtered rinsing liquid.

4. The apparatus of claim 1 further comprising a transport mechanism mounted in said upper chamber, said transport mechanism holding a slide having a semiconductor chip mounted thereon:
   said transport mechanism moving and dipping the slide into the removable container of mercury, the second container containing the mercury dissolving liquid and then the third container containing the rinsing liquid.

5. A method for removing gold ball bonds on the pads of a semiconductor device comprising the steps of:
   providing an environmentally sealed enclosure having a door for loading, said enclosure having an upper and lower chamber;
   said upper chamber environmentally sealed from said lower chamber;
   providing a transport mechanism in said upper chamber;
   positioning a slide on said transport mechanism;
   providing a first tank containing mercury;
   providing a second tank containing a mercury dissolving liquid, said second tank recirculating said mercury dissolving liquid through a first filter for collecting elemental mercury and back into said second tank or out to a first waste line;
   providing a third tank containing a rinsing liquid, said third tank filtering used rinse water through a second filter for collecting elemental mercury and directing the filtered rinse water out to a second waste line;
   mounting the semiconductor chip onto said slide positioned on said transport mechanism in the upper chamber;
   then in sequence, moving and lowering said slide into the first tank containing mercury to immerse said semiconductor chip to a first depth and removing the slide from the first tank containing mercury; repositioning and lowering the slide into said second tank containing the mercury dissolving liquid to immerse said semiconductor chip to a second depth in said mercury dissolving liquid and rotating the slide in a reciprocating motion to dislodge droplets of mercury into the mercury dissolving liquid, removing the semiconductor chip from the second tank containing the mercury dissolving liquid;

repositioning and lowering said slide into said third tank containing the rinsing liquid to immerse the semiconductor chip to a third depth in the rinsing liquid and rotating said slide in a reciprocating motion to dislodge droplets of mercury into the rinsing liquid, removing the slide from the third tank containing the rinsing liquid; and removing said slide and said semiconductor chip from said enclosure.

6. The method of claim 5, wherein said second depth is deeper than said first depth and said third depth is deeper than said second depth.

7. The method of claim 5 wherein said mercury dissolving liquid is nitric acid and said rinsing liquid is water.

* * * * *